(12) United States Patent
Koinuma et al.

(10) Patent No.: US 6,902,317 B2
(45) Date of Patent: Jun. 7, 2005

(54) METHOD AND DEVICE FOR MEASURING THERMOELECTRIC CHARACTERISTICS OF COMBINATORIAL SPECIMEN

(75) Inventors: Hideomi Koinuma, Tokyo (JP); Hitoshi Kawaji, Kanagawa (JP); Kenji Itaka, Tokyo (JP); Hideki Minami, Kanagawa (JP)

(73) Assignee: Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 10/450,709

(22) PCT Filed: Mar. 14, 2002

(86) PCT No.: PCT/JP02/02415
§ 371 (c)(1),
(2), (4) Date: Jun. 24, 2003

(87) PCT Pub. No.: WO02/075297
PCT Pub. Date: Sep. 26, 2002

(65) Prior Publication Data
US 2004/0047398 A1 Mar. 11, 2004

(30) Foreign Application Priority Data
Mar. 16, 2001 (JP) ........................................ 2001-075954

(51) Int. Cl.$^7$ ......................... G01N 25/00; G01N 25/20; G01K 3/00
(52) U.S. Cl. ........................... 374/15; 374/112; 374/43; 374/45
(58) Field of Search ........................... 374/15, 112, 180, 374/30, 43, 45, 113, 137, 142, 163, 166, 167

(56) References Cited

U.S. PATENT DOCUMENTS 3,733,887 A * 5/1973 Stanley et al. ................ 374/44
4,320,344 A * 3/1982 Nicholas ..................... 324/451
5,046,858 A * 9/1991 Tucker ........................ 374/179
5,776,359 A * 7/1998 Schultz et al. .............. 423/263
5,969,238 A * 10/1999 Fischer ....................... 374/142
6,487,515 B1 * 11/2002 Ghoshal ..................... 702/136
6,535,824 B1 * 3/2003 Mansky et al. ............... 702/30

FOREIGN PATENT DOCUMENTS

| DE | 3425561 A1 | * | 1/1985 | .......... G01N/25/00 |
| JP | 05018913 A | * | 1/1993 | .......... G01N/25/00 |
| JP | 5-52783 | | 3/1993 | |
| JP | 05052783 A | * | 3/1993 | .......... G01N/25/18 |
| JP | 06265414 A | * | 9/1994 | .......... G01K/7/00 |
| JP | 06300719 A | * | 10/1994 | .......... G01N/25/00 |
| JP | 07055739 A | * | 3/1995 | .......... G01N/25/18 |
| JP | 07324991 A | * | 12/1995 | ............ G01K/7/02 |
| JP | 9-222403 | | 8/1997 | |
| JP | 10-512840 | | 12/1998 | |

OTHER PUBLICATIONS

Hideomi Koinuma et al.: "21 seiki no zairyo kakumei sendo program (combinatorial gijutsu) 1000nen o 1nen ni chijimeru material highway no kochiku" Comet, Materials Integration, vol. 13, No. 8, pp. 39–44, Jul. 25, 2000.

* cited by examiner

Primary Examiner—Gail Verbitsky
Assistant Examiner—Mirellys Jagan
(74) Attorney, Agent, or Firm—Oblon, Spivak, McClelland, Maier & Neustadt, P.C.

(57) ABSTRACT

A method and device for measuring thermoelectric characteristics of a combinatorial sample. The method and device are useful for rapid sample evaluation, the investigation of thermoelectric materials, and the carrier control of semiconductors. The device includes combinatorial samples patterned with a metal mask, a pair of sample holders for applying a small temperature gradient to the sample, a thermocouple for measuring the temperature gradient, and a probe pin array in contact with the sample.

2 Claims, 4 Drawing Sheets

F I G. 2
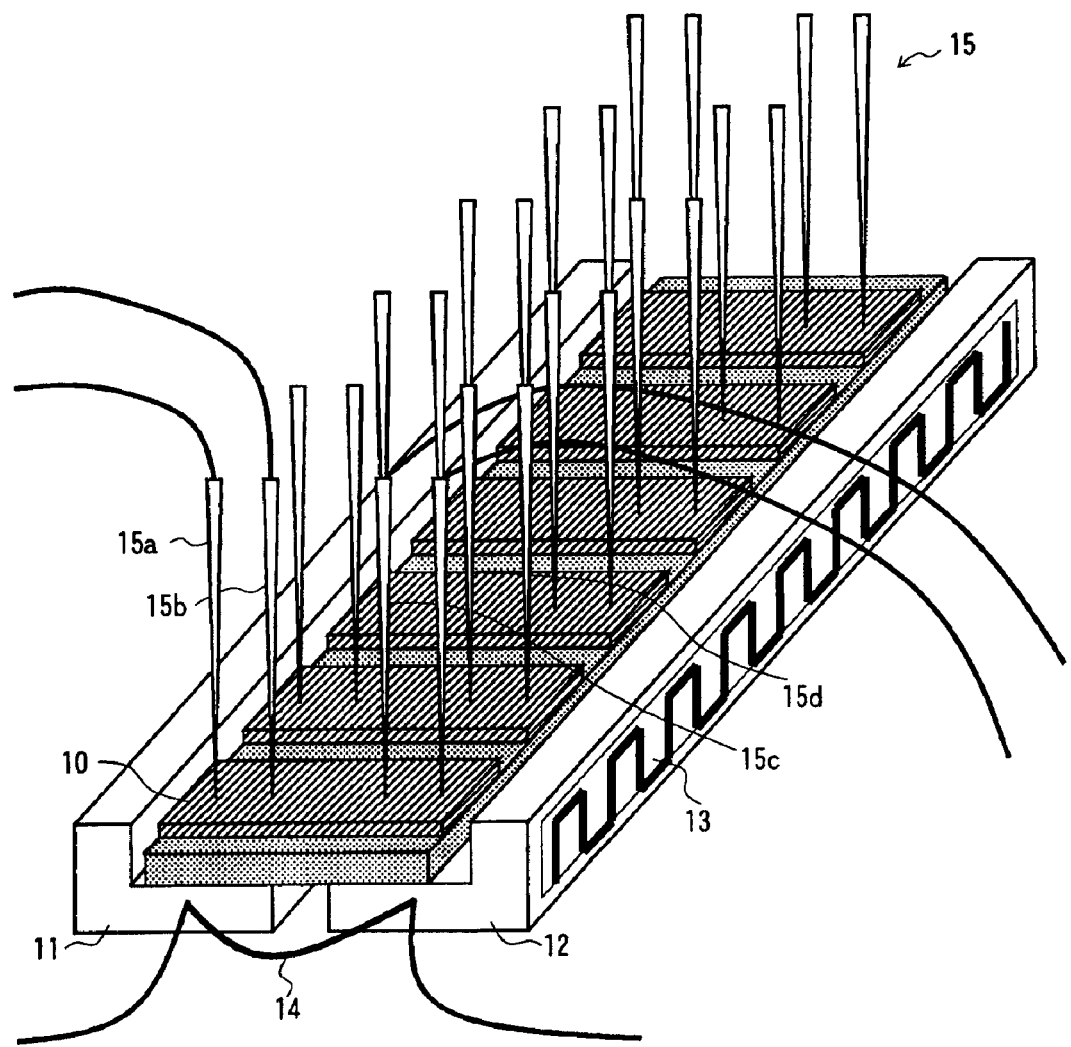

F I G. 4
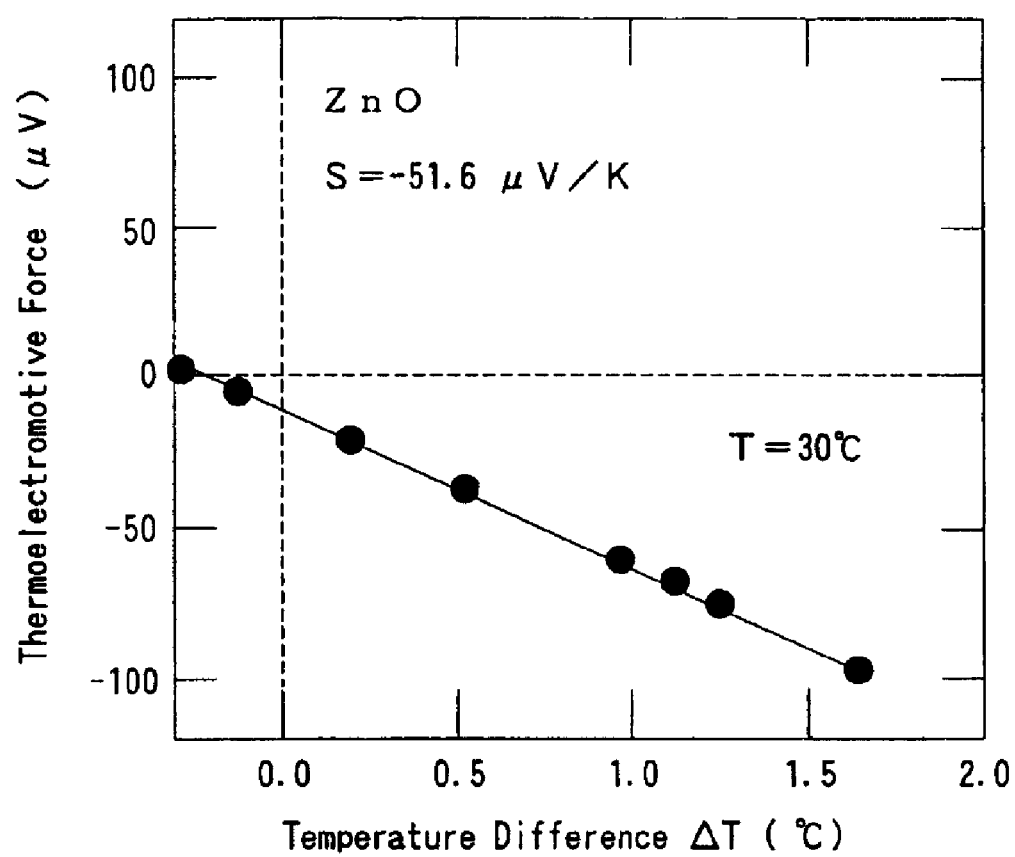

METHOD AND DEVICE FOR MEASURING THERMOELECTRIC CHARACTERISTICS OF COMBINATORIAL SPECIMEN

TECHNICAL FIELD

The present invention relates to a method and device for measuring thermoelectric characteristics of a combinatorial sample.

BACKGROUND ART

Recently, the use of waste energy has become a focus of attention, because the following problems have been in progress: the depletion of fossil energy resources, global warming, and air pollution. Since thermoelectric materials can be used for converting waste heat into electrical energy, electrical energy can be efficiently generated with conventional electric power-generating systems including such thermoelectric materials. Therefore, it is expected that new thermoelectric materials having higher efficiency are developed. Since a junction is cooled by the Peltier effect when a current is applied to a thermoelectric material, such a material is used for cooling systems. Therefore, demands have been made on new thermoelectric materials having higher efficiency.

Furthermore, the following new semiconductors have been recently developed at a feverish pace: wide-gap semiconductors, transparent semiconductors, and organic semiconductors. Carrier control is the key to use such semiconductors for devices. Various devices such as transistors, FETs, diodes, and solar cells, laser oscillators can be manufactured using, for example, junctions (pn junctions) consisting of p-type semiconductors, in which the major carriers are holes, and n-type semiconductors, in which the major carriers are electrons. Therefore, the carrier type is particularly a critical property parameter.

Carrier control is usually performed in such a manner that an undoped sample is subjected to impurity substitution or is heat-treated in an impurity gas atmosphere. However, since the dose is very small, the control is not easy and therefore such treatment is performed by trial and error in many cases. In particular, when the wide-gap semiconductors are treated, either a p type or an n type is apt to be obtained. Therefore, only either type has been fabricated and the conditions of fabrication are strictly limited. Thus, it is necessary to investigate more precise growing conditions and doping conditions.

DISCLOSURE OF INVENTION

In the conventional investigation of thermoelectric materials, a large amount of time has been wasted because such materials are prepared one by one and the thermoelectric characteristics thereof are individually evaluated.

In particular, when combinatorial thin film synthesis is employed, the evaluation method of thermoelectric characteristics is a critical factor and therefore it is necessary to continuously measure a large number of prepared minute samples at high speed.

In the investigation of doping conditions for controlling semiconductor carriers, the Hall resistance and electrical resistance of samples prepared one by one have been individually measured. However, there are the following problems: (1) it takes a long time to evaluate samples because the samples are measured one by one, and (2) the evaluation is not easy because a large magnetic field generator must be used and therefore an instrument is expensive and large.

In order to solve the above problems, it is an object of the present invention to provide a method and device for measuring thermoelectric characteristics of a combinatorial sample, wherein the method and device are useful for rapid sample evaluation, the investigation of thermoelectric materials, and the carrier control of semiconductors.

In order to achieve the above object, the present invention provides the following method and device.

(1) A method for measuring thermoelectric characteristics of a combinatorial sample includes a step of applying a small temperature gradient to a patterned combinatorial sample, disposed between two or more hot baths, to obtain a plurality of electrical signals from the combinatorial sample.

(2) A device for measuring thermoelectric characteristics of a combinatorial sample includes a patterned combinatorial sample, two or more hot baths for applying a small temperature gradient to the sample, a means for measuring the temperature gradient, and a component for obtaining a plurality of electrical signals in the temperature gradient direction, the component being in contact with or being connected to the sample.

The term "hot baths" is herein defined as portions of sample holders. The sample holders do not include simple (sample) holders but include holders having a certain heat capacity so as to maintain the temperature at a constant value during measurement (the holders are actually made of metal such as copper but are not made of, for example, plastic and so on having a small heat capacity). When the relationship between the electrical resistance and the temperature are determined, one hot bath is used. However, when the thermoelectric characteristics are measured, two hot baths must be used.

According to a particular configuration of the present invention, the method for measuring thermoelectric characteristics of a combinatorial sample includes a step of applying a small temperature gradient to a combinatorial sample, patterned by a photolithographic process, to obtain a plurality of electrical signals from the combinatorial sample by wire-bonding.

The device for measuring thermoelectric characteristics of a combinatorial sample includes a combinatorial sample patterned by a photolithographic process, a pair of sample holders for applying a small temperature gradient to the sample, a means for measuring the temperature gradient, and a wire-bonding means connected to the sample.

BRIEF DESCRIPTION OF THE DRAWINGS

FIG. 2 is a perspective view showing a combinatorial thermoelectric characteristic-measuring device including a probe pin array, wherein the device is a first example of the present invention.

FIG. 4 is a graph showing the thermoelectromotive force obtained with a device of the present invention.

BEST MODE FOR CARRYING OUT THE INVENTION

An embodiment of the present invention will now be described in detail.

Figure 1:
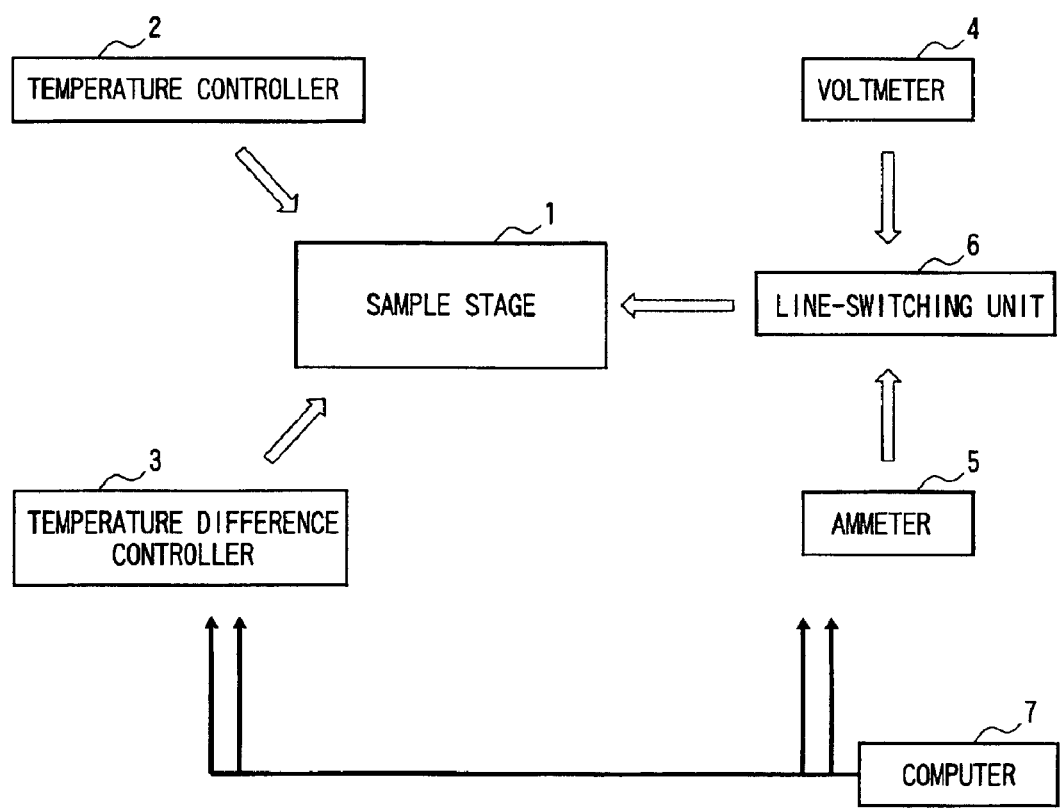
FIG. 1 is a block diagram showing a combinatorial thermoelectric characteristic-measuring device, wherein the device is an example of the present invention.

FIG. 1 is a block diagram showing a combinatorial thermoelectric characteristic-measuring device, wherein the device is an example of the present invention.

In this figure, reference numeral 1 represents a sample stage, reference numeral 2 represents a temperature controller, reference numeral 3 represents a temperature difference controller, reference numeral 4 represents a voltmeter, reference numeral 5 represents an ammeter, reference numeral 6 represents a line-switching unit, and reference numeral 7 represents a computer.

FIG. 2 is a perspective view showing a measuring section of a combinatorial thermoelectric characteristic-measuring system, wherein the measuring section is a first example of the present invention.

In this figure, reference numeral 10 represents two-dimensional combinatorial samples (micro-samples) patterned using a metal mask; reference numerals 11 and 12 represent a pair of sample holders for supporting the samples 10; reference numeral 13 represents a heater disposed on the side of each sample holder; reference numeral 14 represents a thermocouple disposed between a pair of the sample holders 11 and 12; and reference numeral 15 represents a probe pin array arranged so as to be uniformly in contact with a plurality of the combinatorial samples 10 arranged in a line.

A small temperature gradient (for example, a gradient in which the temperature of one sample holder 12 is 3° C. higher than that of the other sample holder 11) is applied to the samples 10, patterned using the metal mask, with the heater 13, and thereby a plurality of electrical signals can be obtained from the combinatorial samples 10 with the probe pin array 15 in contact with the samples 10.

Combinatorial thermoelectric characteristics of the samples can be measured under the same conditions in one operation in such a manner that four probe pins 15a, 15b, 15c, and 15d are arranged in a line and a current is applied between the probe pins 15a and 15d to measure the potential difference between the probe pins 15b and 15c.

After the two-dimensional combinatorial samples used for the measurement is removed from the sample holders 11 and 12, other two-dimensional combinatorial samples can be mounted thereon and then measured under the same conditions.

Figure 3:
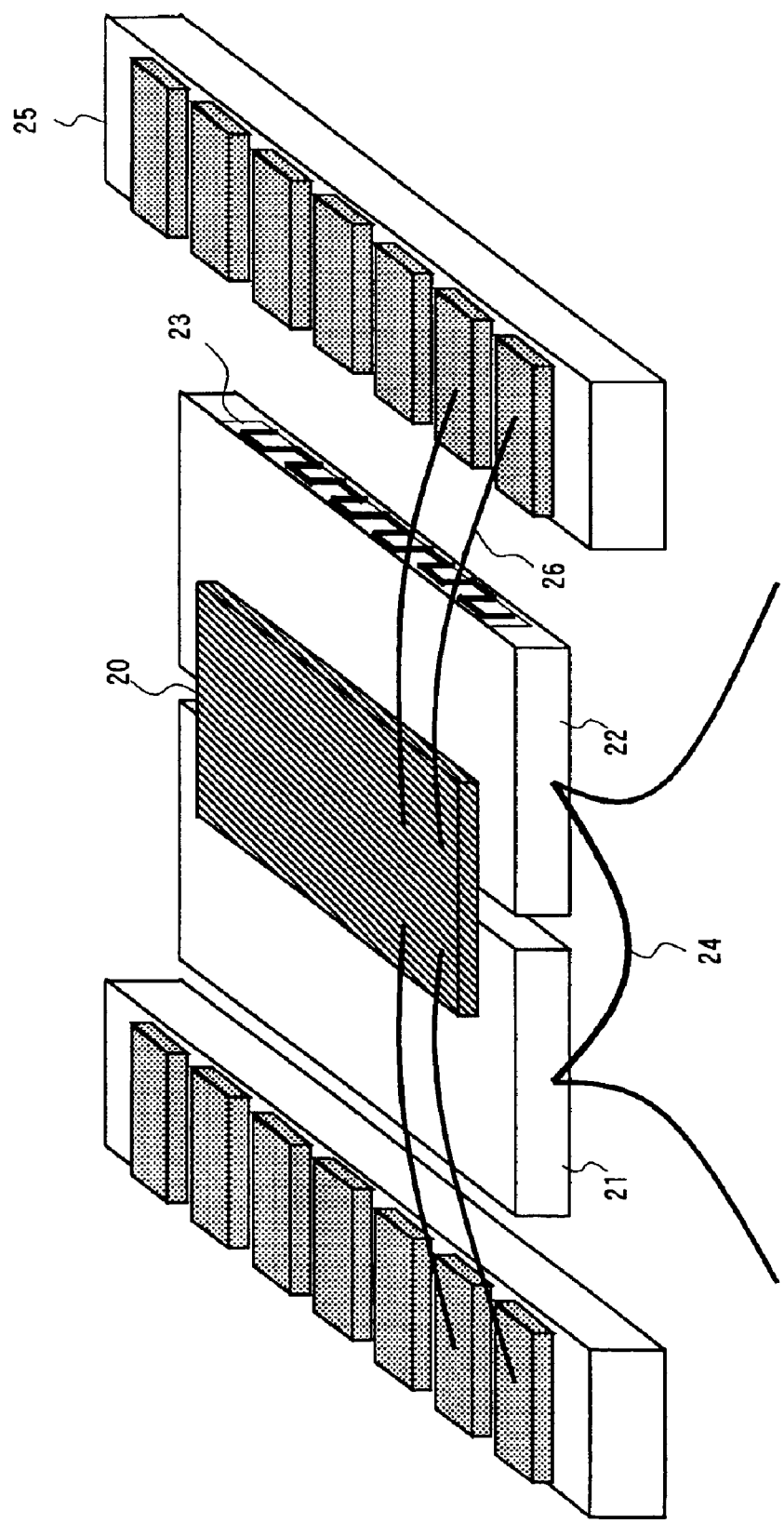
FIG. 3 is a perspective view showing a combinatorial thermoelectric characteristic-measuring device including bonding wires, wherein the device is a second example of the present invention.

FIG. 3 is a perspective view showing a measuring section of a combinatorial thermoelectric characteristic-measuring system, wherein the measuring section is a second example of the present invention.

In this example, bonding wires for connection are used instead of the probe pin array of the first example.

In this figure, reference numeral 20 represents a two-dimensionally arranged combinatorial sample patterned by a photolithographic process, reference numerals 21 and 22 represent a pair of sample holders for supporting the sample 20, reference numeral 23 represents a heater disposed on the side of each sample holder, reference numeral 24 represents a thermocouple disposed between a pair of the sample holders 21 and 22, reference numeral 25 represents bonding terminals, and reference numeral 26 represents bonding wires disposed between the bonding terminals 25 and the sample 20.

A small temperature gradient is applied to the sample 20, patterned by the photolithographic process, with the heater 23, and thereby a plurality of electrical signals can be obtained from the combinatorial sample 20 via the bonding terminal 25 by a wire bonding process using the bonding wires 26.

FIG. 4 is a graph showing the thermoelectromotive force obtained with a device of the present invention. The horizontal axis represents the temperature difference [$\Delta T(° C.)$] and the vertical axis represents the thermoelectromotive force ($\mu V$).

As shown in this figure, the thermoelectromotive force varies linearly with the temperature difference. Thus, this proves that the measurement is correct.

According to the present invention, the following advantages can be obtained.

(1) A small temperature gradient is applied to samples patterned using a metal mask and probe pins are caused to be in contact with the samples, thereby obtaining a large number of electrical signals from the combinatorial samples.

(2) A small temperature gradient is applied to a sample patterned by a photolithographic process, thereby obtaining a large number of electrical signals from the combinatorial sample using bonding wires.

According to the present invention, in a sample prepared by combinatorial thin film synthesis, a large number of data can be obtained from the measurement of the thermoelectromotive force and the electrical resistance. Thereby, high-speed screening is possible when thermoelectric materials are investigated. Thus, the device according to the present invention is an important factor in investigating thermoelectric materials.

The combinatorial thin-film synthesis using a mask system is a high-speed thermoelectric material-investigating technique and has sprung into wide use. When thermoelectric materials are investigated using this technique, it takes a long time to evaluate prepared thin-films, of which the thermoelectric characteristics are measured, because the thin-films are individually subjected to the measurement.

According to the present invention, the thermoelectromotive force and electrical characteristics of thin-films prepared by the combinatorial synthesis can be simultaneously measured, thereby performing the high-speed evaluation of such electrical characteristics. The device can be used in various applications. For example, when carriers are introduced into semiconductors, the device can be used for readily determining whether the charge of the introduced carriers is positive or negative.

In the above examples, two hot baths are used. However, two or more hot baths may be used.

The present invention is not limited to the above examples and various modifications may be performed within the scope of the present invention. It is construed that the present invention covers such modifications.

As described above, according to the present invention, since the thermoelectromotive force and electrical characteristics of thin-films prepared by the combinatorial synthesis can be simultaneously measured, the high-speed evaluation of such electrical characteristics can be performed. Thus, the device according to the present invention is an important factor in investigating thermoelectric materials.

The present invention can be used in various applications. For example, when carriers are introduced into semiconductors, the present invention can be used for readily determining whether the charge of the introduced carriers is positive or negative.

INDUSTRIAL APPLICABILITY

According to the present invention, a method and device for measuring thermoelectric characteristics of a combinatorial sample are important factors in investigating thermoelectric materials. The method and the device can be used in various applications. For example, when carriers are introduced into semiconductors, the method and the device can be used for readily determining whether the charge of the introduced carriers is positive or negative.

What is claimed is:

1. A method for measuring thermoelectric characteristics of a combinatorial sample, comprising the steps of:

applying a small temperature gradient to a patterned combinatorial sample disposed between two or more hot baths with a temperature difference of 3° C. or less;

measuring the temperature gradient of the combinatorial sample;

obtaining a plurality of electrical signals in the temperature gradient direction from the patterned combinatorial sample; and determining the thermoelectric characteristics based on the temperature gradient and the plurality of electrical signals.

2. A device for measuring thermoelectric characteristics of a combinatorial sample, comprising:

a patterned combinatorial sample;

two or more hot baths with a temperature difference of 3° C. or less for applying a small temperature gradient to the patterned combinatorial sample;

a measuring device measuring the temperature gradient; and a component for obtaining a plurality of electrical signals in the temperature gradient direction, the component being in contact with or being connected to the patterned combinatorial sample.

* * * * *